United States Patent
Rumer et al.

(10) Patent No.: US 7,473,995 B2
(45) Date of Patent: Jan. 6, 2009

(54) INTEGRATED HEAT SPREADER, HEAT SINK OR HEAT PIPE WITH PRE-ATTACHED PHASE CHANGE THERMAL INTERFACE MATERIAL AND METHOD OF MAKING AN ELECTRONIC ASSEMBLY

(75) Inventors: Christopher L. Rumer, Chandler, AZ (US); Sabina J. Houle, Phoenix, AZ (US); Saikumar Jayaraman, Chandler, AZ (US); Paul A. Koning, Chandler, AZ (US); Ashay Dani, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/103,801

(22) Filed: Mar. 25, 2002

(65) Prior Publication Data
US 2003/0178720 A1   Sep. 25, 2003

(51) Int. Cl.
H01L 23/28 (2006.01)
H01L 23/495 (2006.01)
H01L 23/12 (2006.01)
H01L 23/10 (2006.01)
H01L 21/00 (2006.01)

(52) U.S. Cl. .............. 257/707; 257/674; 257/704; 257/706; 257/796; 438/122

(58) Field of Classification Search ............. 257/706, 257/707, 718–723, 704, 705, 717, 712
See application file for complete search history.

(56) References Cited

U.S. PATENT DOCUMENTS

| | | | |
|---|---|---|---|
| 4,034,468 A | | 7/1977 | Koopman |
| 4,612,216 A * | | 9/1986 | Kurfman ............. 427/250 |
| 5,137,959 A * | | 8/1992 | Block et al. ........... 524/430 |
| 5,262,225 A * | | 11/1993 | Wilson et al. .......... 428/203 |
| 5,328,087 A * | | 7/1994 | Nelson et al. ......... 156/273.9 |
| 5,445,308 A * | | 8/1995 | Nelson et al. .......... 228/121 |
| 5,608,267 A * | | 3/1997 | Mahulikar et al. ....... 257/706 |
| 5,706,579 A * | | 1/1998 | Ross ..................... 29/840 |
| 6,054,198 A * | | 4/2000 | Bunyan et al. ......... 428/40.5 |
| 6,091,603 A * | | 7/2000 | Daves et al. ......... 165/104.33 |
| 6,097,602 A * | | 8/2000 | Witchger ............... 361/705 |
| 6,114,413 A * | | 9/2000 | Kang et al. ............ 523/205 |
| 6,118,177 A * | | 9/2000 | Lischner et al. ........ 257/704 |
| 6,141,216 A * | | 10/2000 | Holung et al. .......... 361/687 |
| 6,165,612 A * | | 12/2000 | Misra ................ 156/272.2 |

(Continued)

FOREIGN PATENT DOCUMENTS

JP   6-349987   12/1994

OTHER PUBLICATIONS

"U.S. Appl. No. 10/261,676 Response filed Aug. 28, 2007 in response to Non-Final Office Action mailed Jun. 27, 2007", 6 pgs.

(Continued)

*Primary Examiner*—Carl Whitehead, Jr.
*Assistant Examiner*—James Mitchell
(74) *Attorney, Agent, or Firm*—John N. Greaves

(57) ABSTRACT

An integrated heat spreader, heat sink or heat pipe with pre-attached phase change thermal interface material and a method of making an electronic assembly.

12 Claims, 2 Drawing Sheets

U.S. PATENT DOCUMENTS

| | | |
|---|---|---|
| 6,210,520 B1 | 4/2001 | Osuna et al. |
| 6,212,074 B1* | 4/2001 | Gonsalves et al. ........... 165/185 |
| 6,236,568 B1 | 5/2001 | Lai et al. .................... 361/704 |
| 6,285,075 B1* | 9/2001 | Combs et al. ................ 257/675 |
| 6,315,038 B1 | 11/2001 | Chiu |
| 6,324,060 B1* | 11/2001 | Hsu ............................ 165/185 |
| 6,329,713 B1* | 12/2001 | Farquhar et al. ............. 257/712 |
| 6,391,442 B1* | 5/2002 | Duvall et al. ................. 428/348 |
| 6,409,859 B1* | 6/2002 | Chung ......................... 156/69 |
| 6,432,497 B2* | 8/2002 | Bunyan ....................... 257/712 |
| 6,483,707 B1* | 11/2002 | Freuler et al. ................ 361/713 |
| 6,534,861 B1* | 3/2003 | Castro ......................... 257/734 |
| 6,535,388 B1* | 3/2003 | Garcia ......................... 361/704 |
| 6,542,371 B1 | 4/2003 | Webb |
| 6,549,407 B1* | 4/2003 | Sauciuc et al. ............... 361/699 |
| 6,656,770 B2* | 12/2003 | Atwood et al. .............. 438/118 |
| 6,797,758 B2* | 9/2004 | Misra et al. .................. 524/404 |
| 6,869,642 B2 | 3/2005 | Freuler et al. |
| 7,311,967 B2* | 12/2007 | Dani et al. ................... 428/323 |
| 2002/0000239 A1* | 1/2002 | Sachdev et al. ............... 134/2 |
| 2002/0050585 A1* | 5/2002 | Masayuki et al. ............ 252/500 |
| 2002/0086801 A1 | 7/2002 | Khatri |
| 2002/0135984 A1* | 9/2002 | Greenwood et al. .......... 361/708 |
| 2002/0140082 A1* | 10/2002 | Matayabas ................... 257/706 |
| 2002/0141155 A1 | 10/2002 | Pinneo ........................ 361/688 |
| 2002/0149114 A1* | 10/2002 | Soga et al. ................... 257/772 |
| 2002/0177306 A1 | 11/2002 | Gektin |
| 2002/0195587 A1* | 12/2002 | Srivastava et al. ...... 252/301.4 R |
| 2003/0011066 A1 | 1/2003 | McCullough et al. |
| 2003/0027910 A1* | 2/2003 | Misra et al. .................. 524/404 |
| 2003/0051868 A1 | 3/2003 | Dishongh et al. |
| 2003/0057575 A1 | 3/2003 | Gektin |
| 2003/0087475 A1* | 5/2003 | Sterrett et al. ................ 438/108 |
| 2003/0118826 A1 | 6/2003 | Greinke et al. |
| 2003/0132513 A1 | 7/2003 | Chason et al. |
| 2003/0134450 A1 | 7/2003 | Lee |
| 2003/0141592 A1* | 7/2003 | Ma et al. ..................... 257/743 |
| 2003/0143382 A1* | 7/2003 | Xu .............................. 428/209 |
| 2003/0152773 A1* | 8/2003 | Chrysler et al. .............. 428/408 |
| 2003/0153667 A1* | 8/2003 | Jayaraman et al. ........... 524/432 |
| 2003/0160319 A1 | 8/2003 | Zheng et al. |
| 2003/0168731 A1* | 9/2003 | Matayabas et al. ........... 257/712 |
| 2003/0207495 A1 | 11/2003 | Akram |
| 2004/0081803 A1* | 4/2004 | Rauch ......................... 428/172 |
| 2004/0265495 A1 | 12/2004 | Freuler et al. |

OTHER PUBLICATIONS

"U.S. Appl. No. 10/261,676 Final Office Action mailed Feb. 27, 2004", 9 pgs.

"U.S. Appl. No. 10/261,676 Final Office Action mailed Oct. 18, 2005", 9 pgs.

"U.S. Appl. No. 10/261,676 Final Office Action mailed Nov. 2, 2004", 8 pgs.

"U.S. Appl. No. 10/261,676 Non-Final Office Action mailed Jun. 2, 2005", 9 pgs.

"U.S. Appl. No. 10/261,676 Non-Final Office Action mailed Jun. 26, 2007", 7 pgs.

"U.S. Appl. No. 10/261,676 Non-Final Office Action mailed Jul. 3, 2003", 7 pgs.

"U.S. Appl. No. 10/261,676 Non-Final Office Action mailed Dec. 13, 2006", 10 pgs.

"U.S. Appl. No. 10/261,676 Response filed Jan. 3, 2005 in response to Final Office Action mailed Nov. 2, 2004", 7 pgs.

"U.S. Appl. No. 10/261,676 Response filed Jan. 19, 2006 in response to Final Office Action mailed Oct. 18, 2005", 7 pgs.

"U.S. Appl. No. 10/261,676 Response filed Apr. 13, 2007 in response to Non-Final Office Action mailed Dec. 13, 2006", 7 pgs.

"U.S. Appl. No. 10/261,676 Response filed Apr. 27, 2004 in response to Final Office Action mailed Feb. 27, 2004", 8 pgs.

"U.S. Appl. No. 10/261,676 Response filed Jul. 27, 2004 in response to Final Office Action mailed Feb. 27, 2004", 8 pgs.

"U.S. Appl. No. 10/261,676 Response filed Aug. 2, 2005 in response to Non-Final Office Action mailed Jun, 2, 2005", 8 pgs.

"U.S. Appl. No. 10/261,676 Response filed Oct. 31, 2003 in response to Non-Final Office Action mailed Jul. 3, 2003", 9 pgs.

* cited by examiner

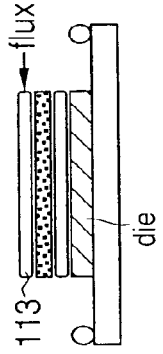
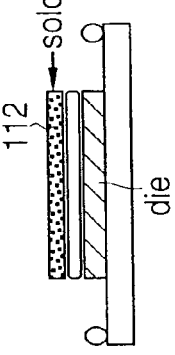
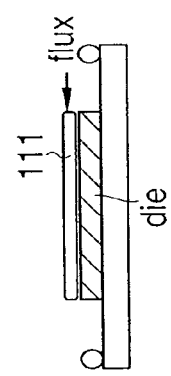
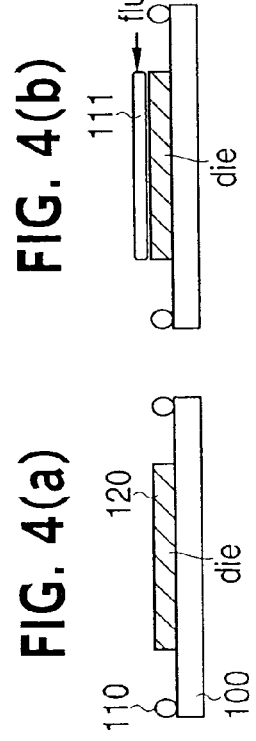
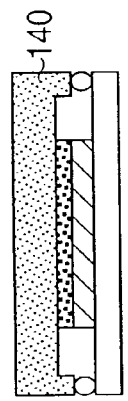
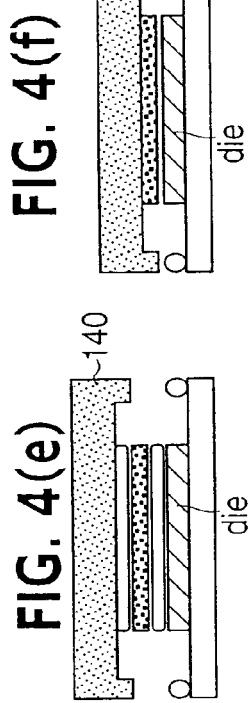
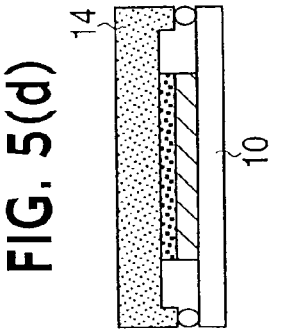
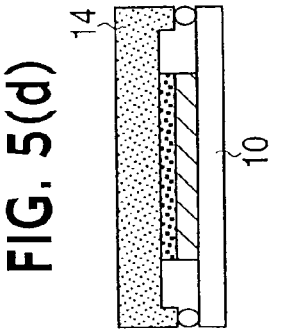
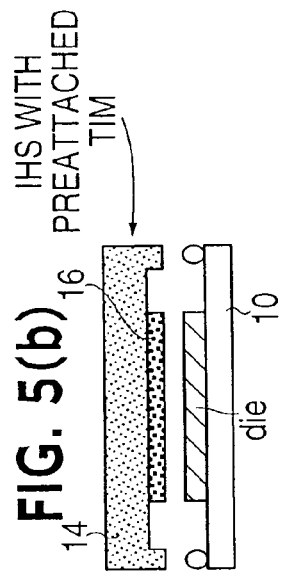
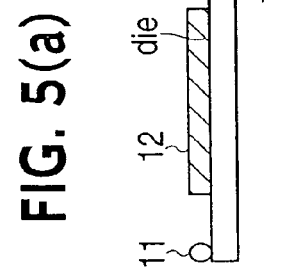

INTEGRATED HEAT SPREADER, HEAT SINK OR HEAT PIPE WITH PRE-ATTACHED PHASE CHANGE THERMAL INTERFACE MATERIAL AND METHOD OF MAKING AN ELECTRONIC ASSEMBLY

FIELD

The present invention is directed to an integrated heat spreader, heat sink or heat pipe with pre-attached phase change thermal interface material and a method of making an electronic assembly.

BACKGROUND

Electrical components such as semiconductors typically generate heat during operation. To prevent excess heat from damaging electrical components, heat dissipating devices such as heat spreaders, heat sinks and heat pipes have been developed. A typical heat spreader, heat sink or heat pipe is made of heat-conducting material and is placed in thermal communication with a heat-generating component so that it draws heat away from the heat-generating component.

Because surfaces of a heat dissipating device and an electrical component are not completely smooth, at least on a microscopic level, it is typically impossible to achieve a perfect contact between a surface of a heat dissipating device and a surface of a electrical component. Since air is a poor thermal conductor, air pockets that may remain between the surfaces can inhibit the conduction of heat from the electrical component to the heat dissipating device. To solve this problem, and to conduct heat from a device that generates heat, such as a die, to a device that dissipates heat, such as a heat spreader, heat sink or heat pipe, thermal interface materials have been developed to fill the gaps between the device that generates heat and the device that dissipates heat. Typically, thermal interface materials are selected to have high thermal conductivity, so that they efficiently facilitate the transfer of heat from the heat-generating device to the heat dissipating device.

A typical electronic assembly or integrated semiconductor package assembly may include a semiconductor die, which generates heat when operated, an integrated heat spreader, heat sink or heat pipe and a thermal interface material interposed between the semiconductor die and the heat spreader, heat sink or heat pipe.

A disadvantageous process for the fabrication of an integrated semiconductor package assembly requires that multiple process steps be carried out at the final stage of assembly. Typically, these steps include dispensing a thermal interface material onto the semiconductor die in liquid or gel form or as a solid, pre-cut preform, placing the heat spreader onto the die so that the heat spreader contacts the thermal interface material, applying spring clips to secure the heat spreader to the die, and then curing the thermal interface material. This process is disadvantageous, particularly if the die and the heat spreader are assembled at a remote time and place from when they are first manufactured, because the thermal interface material must be stored and transported to the remote time and place so that it is on hand at the point of final assembly. For example, it is a common practice for a manufacturer to ship a heat spreader and semiconductor die to a customer in unassembled form, with the customer having the task of joining the two in a semiconductor assembly. Under the disadvantageous process, it is necessary for the customer to obtain the thermal interface material or have it on hand so that it can be applied between the heat spreader and the semiconductor die, as described above. Further, the multiple process steps add to the cost of the integrated semiconductor package assembly.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein:

FIG. 4(a)-(g) are schematic cross-sectional views depicting disadvantageous process steps for fabricating a an integrated semiconductor package assembly, provided as an example for gaining a more thorough understanding/appreciation of the present invention;

FIG. 5(a)-(d) are schematic cross-sectional views depicting process steps for fabricating a an integrated semiconductor package assembly according to an advantageous process of the present invention.

DETAILED DESCRIPTION

Figure 1:
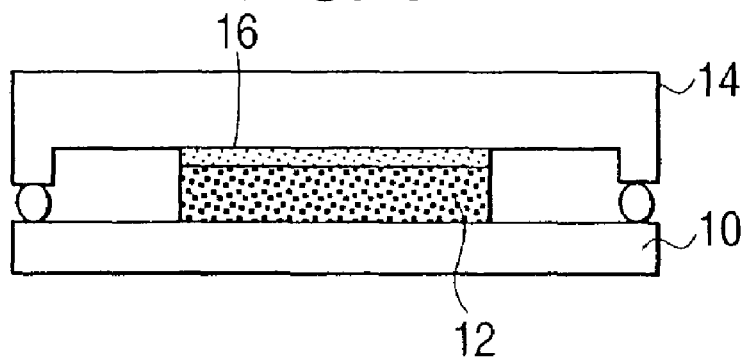
FIG. 1 is a schematic cross-sectional view showing a heat spreader, a thermal interface material and a semiconductor die as part of a integrated semiconductor package assembly.

When appropriate, like reference numerals and characters may be used to designate identical, corresponding or similar components in differing figure drawings. Further, in the detailed description to follow, example sizes/models/values/ranges may be given, although the present invention is not limited to the same.

The present invention relates to a heat dissipating device having a phase change thermal interface material pre-attached to a surface thereof. The phase change thermal interface material has the property of being a solid at room temperature and of becoming a liquid at an elevated temperature above room temperature.

As used herein, the term "room temperature" refers to the temperature of a material in the absence of heat-generating activity such as the operations of an electronic device. Typically, room temperature is the same as the temperature of ambient air. As used herein, the term "elevated temperature" refers to a temperature above room temperature. The elevated temperature may be a temperature that the material reaches when it is in the presence of heat-generating activity such as the operations of an electronic device or it may be a temperature that is higher than the operating temperature of the electronic device and which is reached by heating from an outside source.

The phase change thermal interface material, then, is a material that can be turned into liquid form so that it can be applied to a surface, by, for example heating it the temperature at which it undergoes a solid to liquid transition and then dispensing it onto the surface or applying it by screen printing so that it adheres to the surface, after which it solidifies on the surface when it cools to room temperature.

In one embodiment, the phase change thermal interface material may be a material that, when incorporated into an electronic assembly, is a solid when the electronic device is not in operation, but undergoes a solid to liquid transition when the electronic device heats during operation. As a liquid, the phase change thermal interface material flows to fill any gaps between surfaces of the heat generating device and heat dissipating device, resulting in very low contact resistance and thermal interfacial resistance.

In another embodiment, the phase change thermal interface material may be a material that, when incorporated into an electronic assembly, is a solid unless heated to an elevated temperature that is above the operating temperature of the electronic device, whereupon the phase change thermal interface material cures while flowing to fill any gaps between surfaces of the heat generating device and heat dissipating device. Thereafter, the phase change thermal interface material of this embodiment remains a solid during the normal operation of the electronic device.

The phase change thermal interface material may be a polymer matrix having particles of at least one thermally conductive filler dispersed throughout the matrix. The polymer matrix may be a polymer that undergoes a solid to liquid transition when heated. Examples of polymers may include, but are not limited to, olefinic resins, silicones, acrylic resins, epoxies, urethanes, polyethers and acrylates. The polymer matrix may be selected as curing at an elevated temperature above the operating temperature of typical electronic devices. The polymer matrix may include a crosslinking agent to effect curing at an elevated temperature. Typical crosslinking agents may include, but are not limited to, multifunctional amines, anhydrides, phenolic resins, hydride-functional siloxanes, polyols, peroxides and azides. The exact nature of the crosslinking agent may depend on the polymer selected for the polymer matrix and on the elevated temperature to be employed. Moreover, the polymer matrix may comprise a B-stage prepolymer.

To increase the bulk thermal conductivity of the phase change thermal interface material, at least one thermally conductive filler, such as fusible or non-fusible metallic particles, is dispersed throughout the polymer matrix. Examples of non-fusible fillers include, but are not limited to, Ni, Cu, Ag, Ag/Cu, Sn, graphite, diamond, carbon fiber and Al particles and ceramic fillers including, but not limited to alumina, boron nitride and aluminum nitride particles. Examples of fusible fillers include, but are not limited to, solder particles such as In, In/Sn, In/Ag, Sn/Ag/Cu, Sn/Bi, In/Sn/Bi and In/Zn, Sn/Ag and Sn/In/Ag particles. When fusible filler particles are used, the phase change thermal interface material may be heated to a temperature at which the fusible filler particles fuse, thereby forming a continuous path of thermal conductivity through the material.

It is within the scope of the present invention that combinations of the above described fusible and non-fusible fillers may be used in the phase change thermal interface material.

It is also within the scope of the present invention that the phase change thermal interface material can be made up entirely of a fusible thermally conductive solder material, such as In, In/Sn, In/Ag, Sn/Ag/Cu, Sn/Bi, In/Sn/Bi and In/Zn, Sn/Ag and Sn/In/Ag, without being dispersed in a polymer matrix. The fusible thermally conductive solder material may be in the form of fusible particles that undergo a phase change from being solid at room temperature to becoming a liquid, and fusing, at an elevated temperature above room temperature.

The heat dissipating device is typically used in connection with a device, such as an electronic device, that generates unwanted heat during operation. As an example, in a typical integrated semiconductor package assembly shown schematically in FIG. 1, a semiconductor die 12, which generates heat during operation, rests on a substrate 10, and the heat spreader 14 fits as a lid over the top of the semiconductor die. The thermal interface material 16 fills any gap between the heat spreader and the semiconductor die. Although much of the description herein is directed to a heat spreader and thermal interface material that are used with a semiconductor die, it is to be understood that the present invention may apply broadly to any heat dissipating device that contacts, by way of a thermal interface material, any solid surface or device from which one may want to dissipate heat. Thus, the invention is not limited to integrated heat spreaders, but may also apply to other heat dissipation devices such as heat sinks and heat pipes. Moreover, the invention may also apply to heat dissipation devices that are to be indirectly connected to a heat-generating device. For example, the device of the present invention may be a heat sink that connects to a heat spreader rather than directly contacting an electronic device.

The heat dissipating device may be made of any thermally conductive material, including, but not limited to, metals, such as copper and aluminum, or carbon, including in the form of diamond or as carbon-carbon composites. The surface of the heat dissipating device that has the pre-attached thermal interface material is typically flat and adapted to interface with a surface of the heat generating device.

Figure 2:
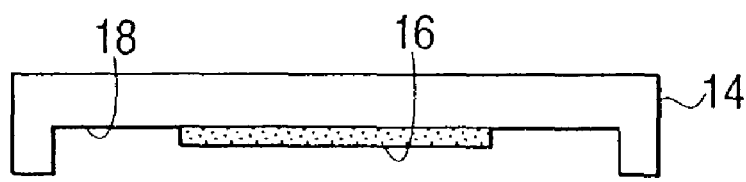
FIG. 2 is a schematic cross-sectional view of a heat spreader with pre-attached phase change thermal interface material.
Figure 3:
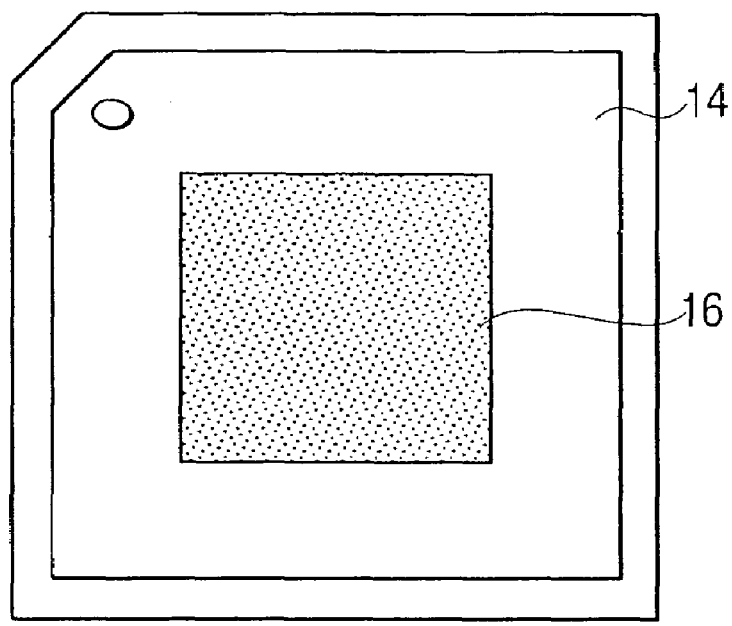
FIG. 3 is a schematic bottom view of a heat spreader with pre-attached phase change thermal interface material.

As shown schematically in FIG. 2 and FIG. 3, a heat spreader with pre-attached phase change thermal interface material according to an embodiment of the present invention comprises a heat spreader 14 with a surface 18 that has a phase change interface material 16 deposited thereon.

To create a heat spreader with pre-attached phase change thermal interface material as described above, the phase change thermal interface material may be heated to a temperature at which it undergoes a solid to liquid transition and then may be applied in liquid form to the surface of the heat spreader that will contact the semiconductor die. The material may be deposited on the surface of the heat spreader by any known methods of depositing a liquid onto a surface so that it adheres to the surface, such methods including dispensing the material onto the surface or screen printing. When the deposited material cools to room temperature, it solidifies and adheres to the surface of the heat spreader. The heat spreader with the pre-attached phase change thermal interface material may then be handled, stored and transported until it is ready to be attached to a semiconductor die.

To create an integrated semiconductor package assembly according to a method of the present invention, the heat spreader having the pre-attached phase change thermal interface material as described above and the semiconductor device are brought into proximity so that the phase change thermal interface material attached to the surface of the heat spreader contacts the surface of the device. The assembly is then heated so that the thermal interface material undergoes a solid to liquid phase change so that the material flows to fill gaps between the heat spreader and the semiconductor die. The material is then allowed to cool and solidify.

A comparison of the processes of FIGS. 4(a)-4(g), showing a disadvangeous method of fabricating an integrated semiconductor package assembly and FIGS. 5(a)-5(d), showing the method of the present invention, clearly shows the advantages of the present invention in the particular instance where the thermal interface material is a polymer/solder hybrid material. As shown in FIG. 4(a), a semiconductor die 120 is provided on a substrate 100, and a sealant 110 is dispensed on the substrate. As shown in FIG. 4(b), a layer of solder flux 111 is then dispensed onto a surface of the semiconductor die; in FIG. 4(c), a layer of solder 112 is then placed on the layer of solder flux; in FIG. 4(d), a layer of solder flux 113 is then placed on the layer of solder; in FIG. 4(e), an integrated heat spreader 140 is then positioned onto the above-mentioned layers; in FIG. 4(f), the assembly is heated so that the solder reflows and FIG. 4(g) shows the completed assembly. In contrast with this process, the method of the present invention requires fewer steps at the point of final assembly. As shown in FIG. 5(a), a semiconductor die 12 is provided on a substrate 10, and a sealant 11 is dispensed on the substrate; in FIG. 5(b), an integrated heat spreader 14 with a pre-attached phase change thermal interface material 16 is positioned on substrate atop the semiconductor die; in FIG. 5(c), the assembly is heated to reflow or cure the phase change thermal interface material. FIG. 5(d) shows the completed assembly.

Similarly, a heat sink or heat pipe with pre-attached phase change thermal interface material may be created by the method described above in relation to the creation of a heat spreader with pre-attached phase change thermal interface material. Further, a heat sink or heat pipe may be physically attached to a component that generates heat during operation, such as a semiconductor die, by the method described above for creating an integrated semiconductor package assembly.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

The invention claimed is:

1. A device comprising:
a heat dissipating member having a surface,; and
a B-stage polymer in a phase change thermal interface material attached to the surface of the heat dissipating member, wherein the B-stage polymer in the phase change thermal interface material has the property of being a solid at room temperature, of becoming a liquid at a first elevated temperature above room temperature, and of becoming a cured solid at a second elevated temperature above first temperature, wherein the phase change thermal interface material comprises a polymer matrix and particles of at least one thermally conductive filler dispersed throughout the polymer matrix, wherein the particles of the at least one thermally conductive filler are fusible particles, and wherein the particles of the at least one thermally conductive filler comprise fusible particles selected from the group consisting of In, In/Sn, In/Ag, Sn/Ag, Sn/In/Ag, Sn/Ag/Cu, Sn/Bi, In/Sn/Bi, In/Zn particles and combinations thereof.

2. The device of claim 1 wherein the heat dissipating member is a heat spreader.

3. The device of claim 1 wherein the heat dissipating member is a heat sink.

4. The device of claim 1 wherein the polymer matrix comprises a polymer selected from the group consisting of olefinic resins, silicones, acrylic resins, epoxies, urethanes, polyethers and acrylates.

5. The device of claim 1 wherein the phase change thermal interface material further includes a crosslinking agent.

6. The device of claim 1 wherein the polymer matrix cures at a second elevated temperature equal to or above the first elevated temperature.

7. The device of claim 1 wherein the particles of the at least one thermally conductive filler comprise non-fusible particles selected from the group consisting of Ni, Cu, Ag, Ag/Cu, Sn, graphite, diamond, carbon fiber, Al, alumina, boron nitride, aluminum nitride particles and combinations thereof.

8. The device of claim 1 wherein the phase change thermal interface material further includes a crosslinking agent selected from multifunctional amines, anhydrides, phenolic resins, hydride-functional siloxanes, polyols, peroxides, and azides.

9. The device of claim 1, wherein the heat dissipating member is a heat pipe.

10. A device comprising:
a heat dissipating member having a surface; and
a B-stage polymer in a phase change thermal interface material attached to the surface of the heat dissipating member, wherein the B-stage polymer in the phase change thermal interface material has the property of being a solid at room temperature, of becoming a liquid at a first elevated temperature above room temperature, and of becoming a cured solid at a second elevated temperature above first temperature, wherein the particles of the at least one thermally conductive filler are fusible particles, wherein the fusible particles are solder particles, and wherein the particles of the at least one thermally conductive filler comprise fusible particles selected from the group consisting of In, In/Sn, In/Ag, Sn/Ag, Sn/In/Ag, Sn/Ag/Cu, Sn/Bi, In/Sn/Bi, In/Zn particles and combinations thereof.

11. A device comprising:
a heat dissipating member having a surface; and
a B-stage polymer in a phase change thermal interface material attached to the surface of the heat dissipating member, wherein the B-stage polymer in the phase change thermal interface material has the property of being a solid at room temperature, of becoming a liquid at a first elevated temperature above room temperature, and of becoming a cured solid at a second elevated temperature above first temperature, wherein the phase change thermal interface material comprises a polymer matrix and particles of at least one thermally conductive filler dispersed throughout the polymer matrix, and wherein the particles of the at least one thermally conductive filler comprise fusible particles selected from the group consisting of In, In/Sn, In/Ag, Sn/Ag, Sn/In/Ag, Sn/Ag/Cu, Sn/Bi, In/Sn/Bi, In/Zn particles and combinations thereof.

12. A device comprising:
a heat dissipating member having a surface; and
a B-stage polymer in a phase change thermal interface material attached to the surface of the heat dissipating member, wherein the B-stage polymer in the phase change thermal interface material has the property of being a solid at room temperature, of becoming a liquid at a first elevated temperature above room temperature, and of becoming a cured solid at a second elevated temperature above first temperature, wherein the phase change thermal interface material comprises a polymer matrix and particles of at least one thermally conductive filler dispersed throughout the polymer matrix, wherein the particles of the at least one thermally conductive filler are fusible particles, wherein the particles of the at least one thermally conductive filler include both fusible particles and nonfusible particles, and wherein the fusible particles of the at least one thermally conductive filler comprise fusible particles selected from the group consisting of In, In/Sn, In/Ag, Sn/Ag, Sn/In/Ag, Sn/Ag/Cu, Sn/Bi, In/Sn/Bi, In/Zn particles and combinations thereof.

* * * * *